US009548748B1

(12) United States Patent
Luo et al.

(10) Patent No.: US 9,548,748 B1
(45) Date of Patent: Jan. 17, 2017

(54) DIGITAL PHASE LOCKED LOOP (PLL) SYSTEM AND METHOD WITH PHASE TRACING

(71) Applicant: GLOBALFOUNDRIES Singapore Pte. Ltd., Singapore (SG)

(72) Inventors: Zhihong Luo, Singapore (SG); Yi Liang, Singapore (SG); Xiaobo Qiu, Singapore (SG); Swee Chuen Hoo, Singapore (SG); Yeung On Au, Singapore (SG); Benjamin Shui Chor Lau, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/867,289

(22) Filed: Sep. 28, 2015

Related U.S. Application Data

(60) Provisional application No. 62/210,739, filed on Aug. 27, 2015.

(51) Int. Cl.
*H03L 7/06* (2006.01)
*H03L 7/099* (2006.01)
*H03L 7/085* (2006.01)

(52) U.S. Cl.
CPC ............ *H03L 7/0991* (2013.01); *H03L 7/085* (2013.01)

(58) Field of Classification Search
None
See application file for complete search history.

(56) References Cited

U.S. PATENT DOCUMENTS

| 6,356,158 | B1 | 3/2002 | Lesea |
| 6,922,047 | B2 | 7/2005 | Knoll et al. |
| 7,332,973 | B2 * | 2/2008 | Lee ........................ G04F 10/005 327/12 |
| 7,479,814 | B1 * | 1/2009 | Kaviani .................. H03L 7/087 326/105 |
| 7,800,454 | B2 | 9/2010 | Vanselow et al. |
| 7,859,344 | B2 | 12/2010 | Uozumi et al. |
| 8,237,475 | B1 | 8/2012 | Nagarajan et al. |
| 8,471,614 | B2 | 6/2013 | Luo |

(Continued)

OTHER PUBLICATIONS

United States Patent Office, United States Utility Patent Application for U.S. Appl. No. 14/867,298, filed Sep. 28, 2015.

(Continued)

*Primary Examiner* — Cassandra Cox
(74) *Attorney, Agent, or Firm* — Lorenz & Kopf, LLP

(57) ABSTRACT

A PLL control system is provided that implements a phase tracer module to reduce lock time and output clock jitter. A second clock signal is generated by dividing a frequency of a reference clock signal. A feedback clock signal is generated based on a high-frequency clock signal from a digitally controlled oscillator (DCO) and a PLL feedback divide number. Lead/lag determination circuitry generates a lead/lag detection result that indicates whether the feedback clock signal leads or lags the second clock signal. A skew digitizer digitizes a skew between a falling edge of the second clock signal and a rising edge of the feedback clock signal to generate a skew signal. The phase tracer module processes the lead/lag detection result and the skew signal to generate a digital control signal that controls cycle time of the DCO to change frequency of the high-frequency clock signal.

20 Claims, 8 Drawing Sheets

(56) References Cited

U.S. PATENT DOCUMENTS

| | | | |
|---|---|---|---|
| 8,604,852 B1 | 12/2013 | Turullois et al. | |
| 8,610,511 B1 | 12/2013 | Elrabaa | |
| 8,634,511 B2* | 1/2014 | Hong | H03L 7/085 |
| | | | 327/146 |
| 8,692,598 B2 | 4/2014 | Havens | |
| 2011/0089982 A1* | 4/2011 | Hsieh | H03L 7/091 |
| | | | 327/156 |
| 2011/0095794 A1 | 4/2011 | Dubost et al. | |
| 2011/0140747 A1 | 6/2011 | Endo et al. | |
| 2012/0183104 A1* | 7/2012 | Hong | H03L 7/085 |
| | | | 375/340 |
| 2012/0319748 A1 | 12/2012 | Luo | |
| 2015/0008960 A1* | 1/2015 | Lahr | H03L 7/095 |
| | | | 327/5 |

OTHER PUBLICATIONS

United States Patent Office, United States Utility Patent Application for U.S. Appl. No. 14/958,330, filed Dec. 3, 2015.
United States Patent Office, Notice of Allowance and Fee(s) Due for U.S. Appl. No. 14/958,330 mailed Aug. 12, 2016.

* cited by examiner

DIGITAL PHASE LOCKED LOOP (PLL) SYSTEM AND METHOD WITH PHASE TRACING

CROSS-REFERENCE TO RELATED APPLICATION

This application claims the benefit of U.S. Provisional Application No. 62/210,739 filed Aug. 27, 2015, which is hereby incorporated by reference in its entirety.

TECHNICAL FIELD

Embodiments of the subject matter described herein relate generally to phase locked loop (PLL) control, and more particularly, to a digital PLL control system and method that implements a phase tracer module to reduce lock time and output clock jitter.

BACKGROUND

PLL control circuits are widely used in radio, telecommunications, computers and other electronic applications. They may generate stable frequencies, recover a signal from a noisy communication channel, or distribute clock timing pulses in digital logic designs such as microprocessors. Traditionally, the PLL circuit has been an analog block, including the basic components of a voltage control oscillator (VCO), phase and frequency detector (PFD), charge pump, low pass filter (LPF) and a feedback path. However, such analog PLL circuits include a number of capacitors which require a significantly large chip area. Additionally these circuits are very sensitive to power noise.

More recently, PLL circuit design has evolved to a greater use of digital control. The first generation digital PLL uses one external high frequency clock to sample the reference clock, then generates the output clock by dividing or multiplying a certain number according to requirement. The frequency of an external clock having accuracy required by such PLL circuit is limited with respect to its capability for applying a sampling rate that can accommodate high frequency reference clock signals. As this design can only be used in low frequency applications, a hybridization of analog and digital elements has been pursued. With such approach, chip area has not been significantly reduced, while performance is markedly decreased.

In one conventional PLL control system, to trace the phase of a reference clock, the cycle time of a feedback clock is adjusted based on (1) whether the feedback clock leads or lags the reference clock, and (2) the absolute value of skew between the two clocks. In a conventional PLL control system, the feedback clock needs a relatively long time to capture the phase of the reference clock. One problem is that the speed difference between the feedback clock and the reference clock is not considered, and therefore the actual feedback clock speed cannot be adjusted properly. This approach can result in skew oscillation such that the jitter is too large (e.g., cannot be reduced to a minimum or sufficiently small value). Moreover, this approach also requires a longer time for PLL to reach lock status (i.e., to get to a lock status from an unlock status).

A need exists for an improved PLL control system. Performance capabilities, such as high DCO frequency range, long term jitter control, low power consumption, low lock time, are highly desirable. Such a digital PLL circuit should encompass a small chip area and exemplify good performance.

Furthermore, other desirable features and characteristics of the present invention will become apparent from the subsequent detailed description of the invention and the appended claims, taken in conjunction with the accompanying drawings and this background of the invention.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

BRIEF SUMMARY OF EMBODIMENTS

A phase locked loop (PLL) control system is provided that implements a phase tracer module to reduce lock time and output clock jitter. A clock signal generator divides a frequency of a reference clock signal to generate a second clock signal. A synchronous high-speed counter generates a feedback clock signal based on a high-frequency clock signal from a digitally controlled oscillator (DCO) and a PLL feedback divide number. Based on the second clock signal and the feedback clock signal, lead/lag determination circuitry generates a lead/lag detection result that indicates whether the feedback clock signal leads or lags the second clock signal. A skew digitizer digitizes a skew between a falling edge of the second clock signal and a rising edge of the feedback clock signal to generate a skew signal that indicates the skew between the falling edge of the second clock signal and the rising edge of the feedback clock signal. During each cycle of the second clock signal, the phase tracer module processes the lead/lag detection result and the skew signal to generate a digital control signal that controls cycle time of the DCO to change frequency of the high-frequency clock signal.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

The connecting lines shown in the various figures contained herein are intended to represent example functional relationships and/or physical couplings between the various elements. It should be noted that many alternative or additional functional relationships or physical connections may be present in an embodiment. As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The following description refers to elements or nodes or features being "connected" or "coupled" together. As used herein, unless expressly stated otherwise, "coupled" means that one element/node/feature is directly or indirectly joined to (or directly or indirectly communicates with) another element/node/feature, and not necessarily mechanically. Likewise, unless expressly stated otherwise, "connected" means that one element/node/feature is directly joined to (or directly communicates with) another element/node/feature, and not necessarily mechanically. In addition, certain terminology may also be used in the following description for the purpose of reference only, and thus are not intended to be limiting. For example, terms such as "first," "second," and other such numerical terms referring to elements or features do not imply a sequence or order unless clearly indicated by the context.

In a conventional PLL control system, such as that described above, the feedback clock needs a relatively long time to capture the phase of the reference clock. One problem is that the speed difference between the feedback clock and the reference clock is not considered, and therefore the actual feedback clock speed cannot be adjusted properly. This approach can result in skew oscillation such that the jitter is too large (e.g., cannot be reduced to a minimum or sufficiently small value). Moreover, this approach also requires a longer time for PLL to reach lock status (i.e., to get to a lock status from an unlock status).

Figure 1:
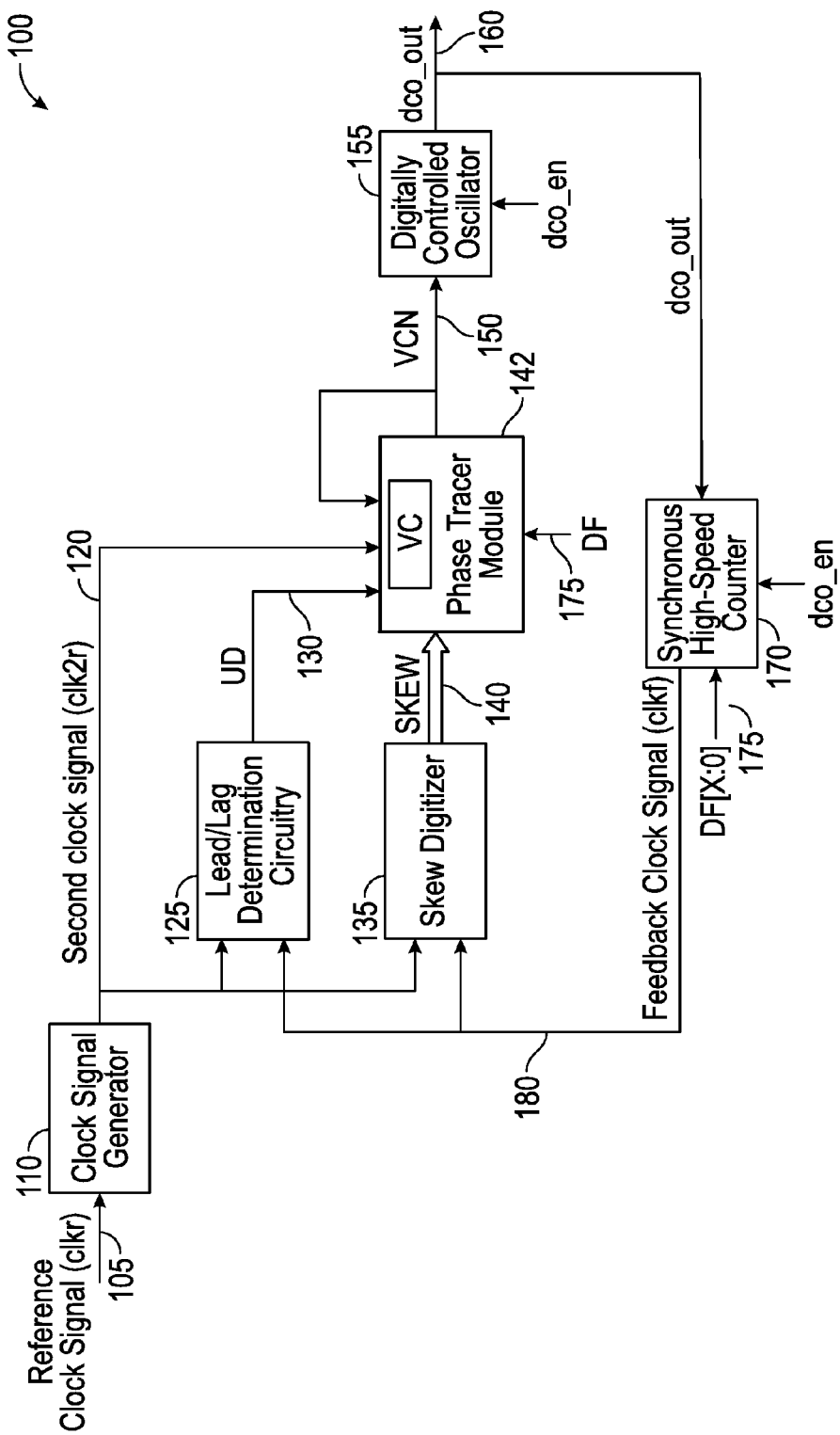
FIG. 1 is a block diagram of a PLL control system in accordance with the disclosed embodiments.

FIG. 1 is a block diagram of a PLL control system 100 in accordance with the disclosed embodiments. The PLL control system 100 includes a clock signal generator 110, a lead/lag determination circuitry 125, a skew digitizer 135, a phase tracer module 142, a digitally controlled oscillator (DCO) 155, and a synchronous high-speed counter 170. FIG. 1 will be described with reference to FIGS. 2-11. The PLL control system 100 receives a reference clock signal (clkr) 105 and produces a DCO output signal (dco_out) 160 that can be used to generate an output clock signal (not illustrated). The DCO output signal (dco_out) 160 is a high frequency clock signal output by the DCO 155.

Figure 2:
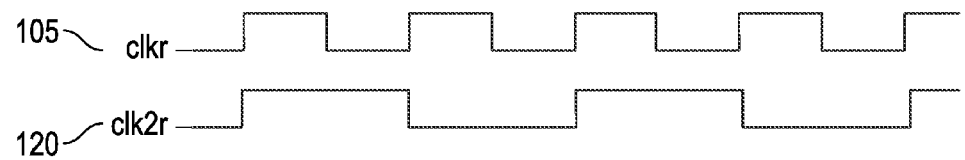
FIG. 2 is a waveform diagram illustrating a reference clock signal and a second clock signal in accordance with the disclosed embodiments.

The clock signal generator 110 is configured to receive the reference clock signal (clkr) 105, and based on the reference clock signal (clkr) 105, generates outputs including a second clock signal (clk2r) 120. The clock signal generator 110 divides the frequency the reference clock signal (clkr) 105 by 2 to produce the second clock signal (clk2r) 120 having a duty cycle of 50%. FIG. 2 is a waveform diagram illustrating the reference clock signal (clkr) 105, the second clock signal (clk2r) 120 of the PLL control system 100 in accordance with the disclosed embodiments. As will be described below, the second clock signal (clk2r) 120 is the operating clock for the phase tracer module 142.

The DCO 155 generates a high frequency clock signal 160. Based on (or using) the high-frequency clock signal 160 and a PLL feedback divide number (DF) 175, the synchronous high-speed counter 170 generates a feedback clock signal (clkf) 180. By changing/controlling cycle time ($T_{DCO}$) of the DCO 155, the frequency of the high-frequency clock signal 160 output by the DCO 155 can be controlled (e.g., the cycle time ($T_{DCO}$) of the DCO 155 determines the frequency of the high-frequency clock signal 160). In this system, the cycle time ($T_{DCO}$) of the DCO 155 will be at its expected value when the cycle time ($T_{clkf}$) of the feedback clock signal (clkf) 180 substantially matches the cycle time ($T_{clk2r}$) of the second clock signal (clk2r) 120.

So that the actual speed of the feedback clock signal (clkf) 180 can be adjusted properly, any speed difference between the feedback clock signal (clkf) 180 and the second clock signal (clk2r) 120 should be considered. As shown in equation (1), the cycle time ($T_{clkf}$) of the feedback clock signal (clkf) 180 can be expressed as:

$$T_{clkf} = DF * T_{DCO} \qquad \text{Equation (1)}$$

In other words, the cycle time ($T_{clkf}$) of the feedback clock signal (clkf) 180 is a function of the cycle time ($T_{DCO}$) of the DCO 155. For this reason, it is important to be able to accurately adjust the half cycle time (i.e., $DF*T_{DCO}$) of the feedback clock signal (clkf) 180 based on: (1) whether the feedback clock signal (clkf) 180 leads or lags the second clock signal (clk2r) 120, (2) how much skew there is between the second clock signal (clk2r) 120 and the feedback clock signal (clkf) 180, (3) whether the actual frequency of the DCO 155 is higher or lower than expected, and (4) how much speed gap there is between the actual speed of the DCO 155 and the expected speed of the DCO 155.

The synchronous high-speed counter 170 is configured to receive a DCO output signal (dco_out) 160 and a PLL feedback divide number (DF) 175, and perform processing to generate a feedback clock signal (clkf) 180 based on the DCO output signal (dco_out) 160 and the PLL feedback divide number (DF) 175. As an example, if the frequency of the DCO output signal (dco_out) 160 is 1 GHz, and the PLL feedback divide number (DF) 175 is equal to 100, then the feedback clock signal (clkf) 180 will turn-over every 100 cycle times of the DCO output signal (dco_out) 160, and the frequency of feedback clock signal (clkf) 180 will be around 5 MHz.

The lead/lag determination circuitry 125 is configured to receive the second clock signal (clk2r) 120 and the feedback clock signal (clkf) 180, and generate a lead/lag detection result 130 (UD) based on the second clock signal (clk2r) 120 and the feedback clock signal (clkf) 180. The lead/lag detection result (UD) 130 indicates whether the feedback clock signal (clkf) 180 leads or lags the second clock signal (clk2r) 120.

Figure 3:
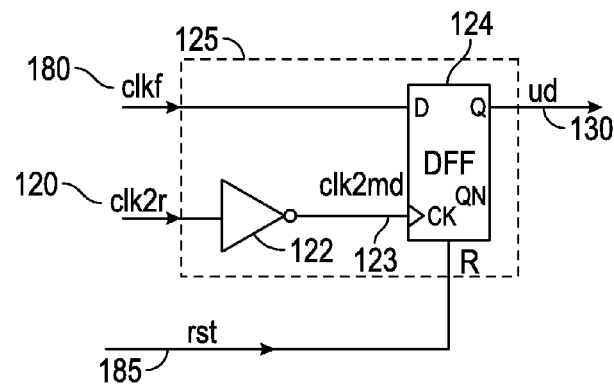
FIG. 3 is a block diagram of the lead/lag determination circuitry in accordance with one exemplary implementation of the disclosed embodiments.
Figure 4:
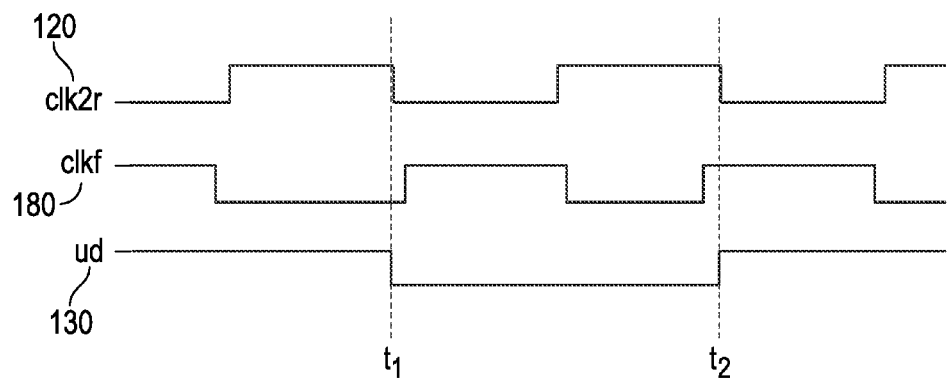
FIG. 4 is a waveform diagram illustrating a second clock signal, a feedback clock signal and a lead/lag detection result in accordance with the disclosed embodiments.

FIG. 3 is a block diagram of the lead/lag determination circuitry 125 in accordance with one exemplary implementation of the disclosed embodiments. As illustrated in FIG. 3, the lead/lag determination circuitry 125 includes an inverter 122 and a D flip-flop 124. The inverter 122 receives and inverts the second clock signal (clk2r) 120 to generate an inverted version of the second clock signal (clk2rnd) 123. The D flip-flop 124 is receives the feedback clock signal (clkf) 180 and the inverted version of the second clock signal (clk2rnd) 123 and a reset signal 185. Based on the inverted version of the second clock signal (clk2rnd) 123 and the feedback clock signal (clkf) 180, the D flip-flop 124 generates the lead/lag detection result 130 (UD). FIG. 4 is a waveform diagram illustrating the second clock signal (clk2r) 120, the feedback clock signal (clkf) 180 and the lead/lag detection result 130 (UD) of the PLL control system 100 in accordance with the disclosed embodiments. As illustrated in FIG. 4, in this particular example, at time t1, the feedback clock signal (clkf) 180 lags the second clock signal (clk2r) 120 by a certain amount such that the lead/lag detection result 130 (UD) is low (e.g., has a logical zero value) to indicate a lag detection result. By contrast, at time t2, the feedback clock signal (clkf) 180 leads the second clock signal (clk2r) 120 by a certain amount such that the lead/lag detection result 130 (UD) is high (e.g., has a logical one value) to indicate a lag detection result.

The skew digitizer 135 is configured to receive the second clock signal (clk2r) 120 and the feedback clock signal (clkf) 180, and digitize the skew between the falling edge of the second clock signal (clk2r) 120 and the rising edge of feedback clock signal (clkf) 180 to generate a skew signal 140 that indicates the skew (SV) between the second clock signal (clk2r) 120 and the feedback clock signal (clkf) 180.

Figure 5:
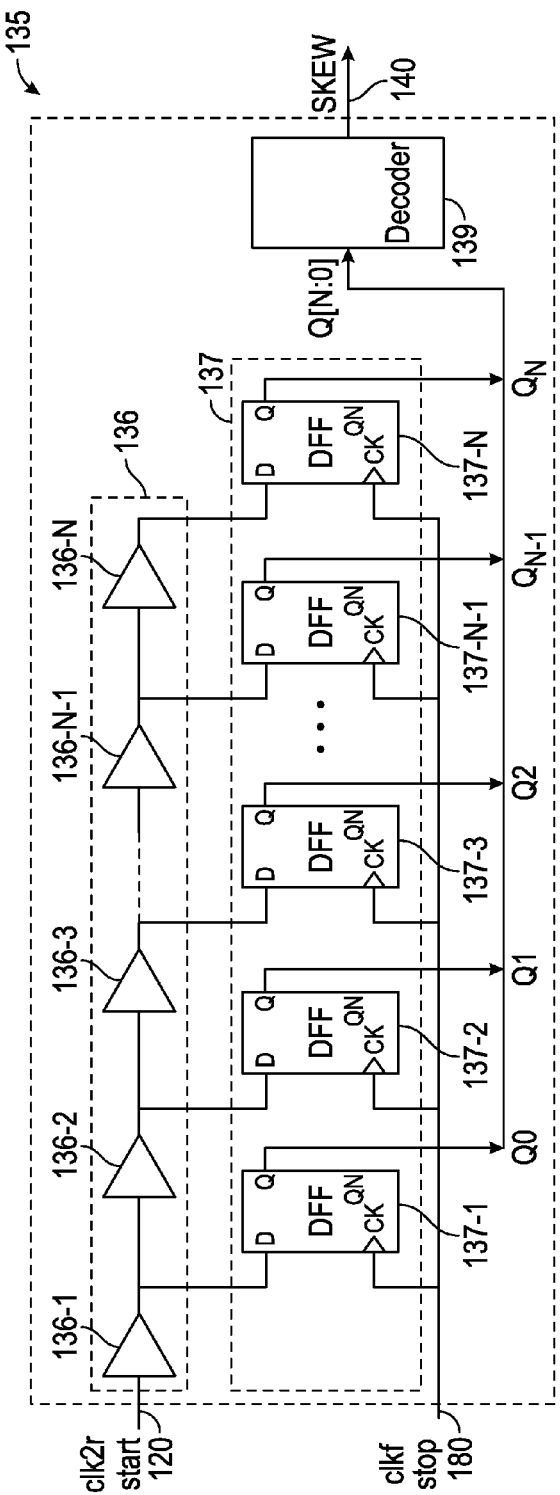
FIG. 5 is a schematic diagram of a skew digitizer of FIG. 1 in accordance with one exemplary implementation of the disclosed embodiments.
Figure 6:
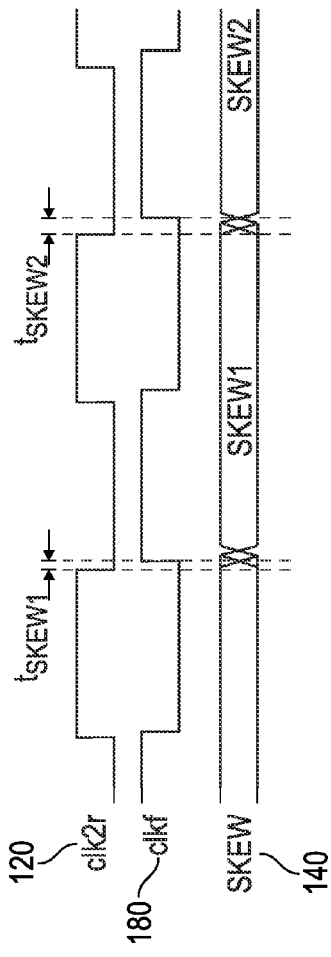
FIG. 6 is a waveform diagram illustrating a second clock signal, a feedback clock signal, and a skew signal of the PLL control system in accordance with the disclosed embodiments.

FIG. 5 is a schematic diagram of the skew digitizer 135 of FIG. 1 in accordance with one exemplary implementation of the disclosed embodiments. The skew digitizer 135 includes a buffer chain 136 that includes a plurality of buffers 136-1 . . . 136-N, a flip-flop chain 137 that includes a plurality of D flip-flops 137-1 . . . 137-N, and a decoder 139. FIG. 6 is a waveform diagram illustrating the second clock signal (clk2r) 120, the feedback clock signal (clkf) 180, and the skew signal 140 of the PLL control system 100 in accordance with the disclosed embodiments. Referring again to FIG. 5, at each falling edge of the second clock signal (clk2r) 120 (or start signal 120), a logical zero (0) starts to ripple along the buffer chain 136. Each buffer 136 generates an output value that is provided to one of the D flip-flops 137-1 . . . 137-N. At the rising edge of the feedback clock signal (clkf), all the values on the buffer chain 136 are registered into the flip-flop chain 137 (i.e., each of the output values from the buffer chain 136 are registered at a corresponding one of the D flip-flops 137-1 . . . 137-N). Each of the D flip-flops 137-1 . . . 137-N sample the state of it's corresponding buffer 136-1 . . . 136-N of the delay line on the rising edge of the feedback clock signal (clkf) 180 (or stop signal 180), and generates an output. The output of all the D flip-flops 137 are combined and sent to decoder 139 as a signal vector Q [N:0], which is the combined output from each flip-flop 137-1 . . . 137-N. The decoder 139 decodes the signal vector Q [N:0] to generate the skew signal 140, which indicates the skew between the falling edge of the second clock signal (clk2r) 120 and the rising edge of the feedback clock signal (clkf).

The phase tracer module 142 operates once each cycle of the second clock signal (clk2r) 120. That is, during each cycle of the second clock signal (clk2r) 120, the phase tracer module 142 can generate a digital control (VCN) signal 150 that controls cycle time ($T_{DCO}$) of the DCO 155 to change frequency of the high-frequency clock signal 160. The phase tracer module 142 is configured to receive the second clock signal (clk2r) 120, the lead/lag detection result 130 (UD) and the skew signal 140, and to perform processing to generate the digital control (VCN) signal 150 based on the second clock signal (clk2r) 120, the lead/lag detection result 130 (UD) and the skew signal 140. In one embodiment, the digital control signal 150 is an 8-bit vector (VCN) that changes the cycle time ($T_{DCO}$) of the DCO 155, which in turn changes the frequency of the high-frequency clock signal 160. The cycle time ($T_{DCO}$) of the DCO 155 can be expressed as $T_{DCO}=ID+T_{DU}*VCN$. The cycle time adjustment ($\Delta T_{DCO}$) to be applied at DCO 155 to adjust cycle time ($T_{DCO}$) of the DCO 155 can be expressed as $\Delta T_{DCO}=\Delta VCN*T_{DU}$, where $\Delta VCN$ is a step adjustment ($\Delta VCN$) 148, and where $T_{DU}$ is the unit DCO cycle time change ($T_{DU}$). The digital control signal 150 indicates speed gap and skew adjustments to be applied at DCO 155 to change the frequency and cycle time of the DCO output signal (dco_out) 160. The phase tracer module 142 dynamically adjusts the digital control signal 150, based on the lead/lag detection result 130 (UD) and the skew signal 140 (and other information), such that frequency and phase of the DCO output signal (dco_out) 160 will substantially match frequency and phase of the reference clock signal (clkr) 105.

The DCO 155 is configured to receive the digital control signal 150. The digital control signal 150 is applied at the DCO 155 to generate the DCO output clock signal (dco_out) 160. By changing the digital control signal 150, the frequency of the DCO output signal (dco_out) 160 will also be changed. The DCO output signal (dco_out) 160 can be provided, for example, as system-on-a chip (SOC) clocks used in communication applications, consumer applications, computer applications, etc.

Figure 7:
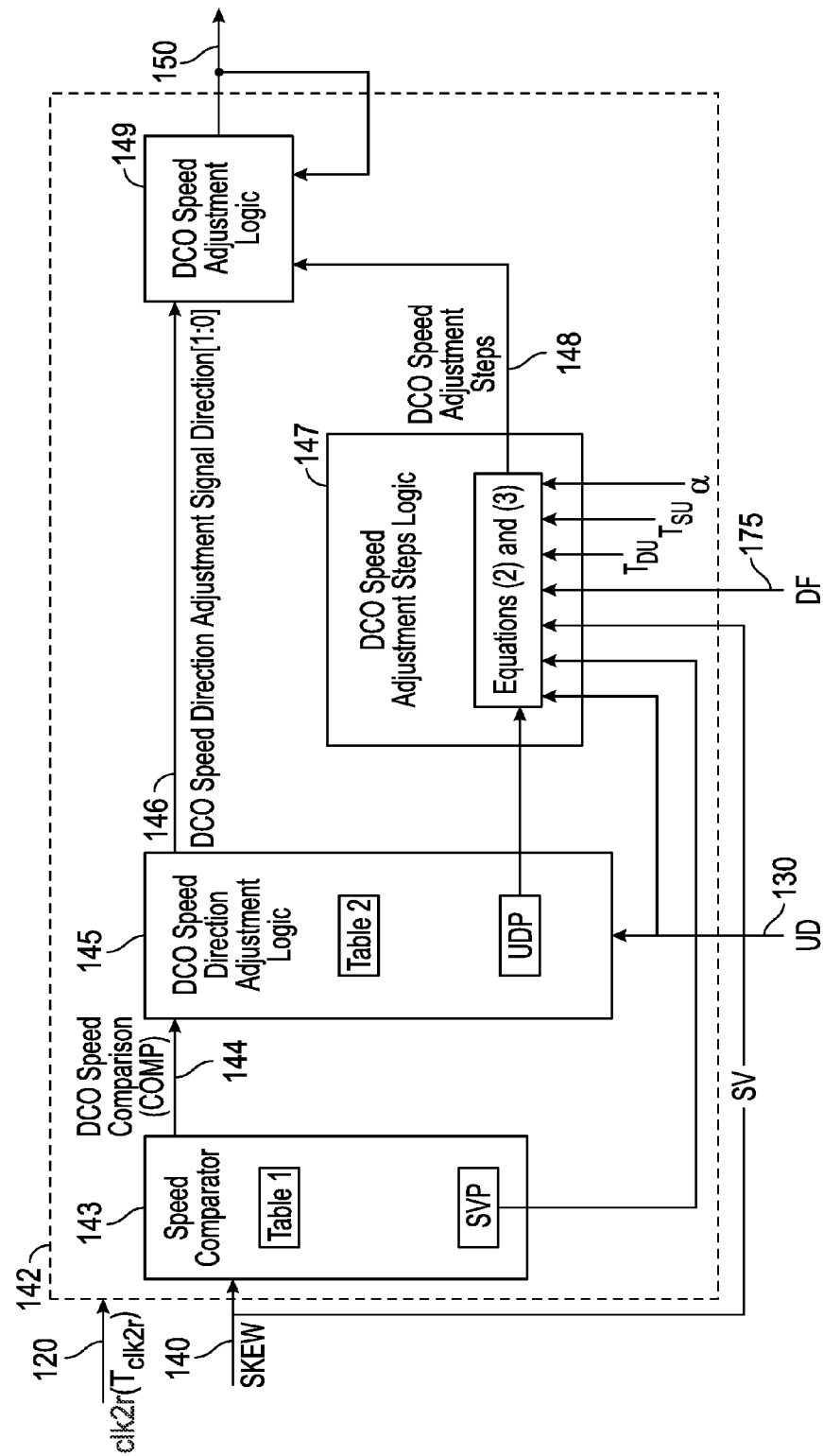
FIG. 7 is a block diagram of the phase tracer module in accordance with one exemplary implementation of the disclosed embodiments.

FIG. 7 is a block diagram of the phase tracer module 142 in accordance with one exemplary implementation of the disclosed embodiments. The phase tracer module 142 includes a speed comparator 143, DCO speed direction adjustment logic 145, DCO speed step adjustment logic 147, and DCO speed adjustment logic 149.

The speed comparator 143 receives the skew signal 140 and determines a current skew value (SV) between the falling edge of the second clock signal (clk2r) 120 and the rising edge feedback clock signal (clkf) 180 for the current cycle of the second clock signal (clk2r) 120. The speed comparator 143 also stores a previous skew value (SVP) 140' between the falling edge of the second clock signal (clk2r) 120 and the rising edge feedback clock signal (clkf) 180 during a previous cycle of the second clock signal (clk2r) 120. The speed comparator 143 can then compare the current skew value (SV) to the previous skew value (SVP)

to determine if the current skew value (SV) is smaller than the previous skew value (SVP) 140' and then generate an appropriate comparison result (COMP).

As illustrated in Table 1 (below), when the speed comparator 143 determines that the current skew value (SV) is less than the previous skew value (SVP), the speed comparator 143 generates a first comparison result (COMP=1). When the speed comparator 143 determines that the current skew value (SV) is greater than or equal to the previous skew value (SVP), the speed comparator 143 generates a second comparison result (COMP=0).

TABLE 1

|  | COMP |
|---|---|
| SV < SVP | 1 |
| SV >= SVP | 0 |

The DCO speed direction adjustment logic 145 stores a previous lead/lag detection result (UDP) 130' that has either a first logical value (e.g., logic 0) when the feedback clock signal (clkf) 180 for a previous cycle of the second clock signal (clk2r) 120 lags the second clock signal (clk2r) 120 for the previous cycle of the second clock signal (clk2r) 120, or a second logical value (e.g., logic 1) when the feedback clock signal (clkf) 180 for the previous cycle of the second clock signal (clk2r) 120 leads the second clock signal (clk2r) 120 for the previous cycle of the second clock signal (clk2r) 120. The DCO speed direction adjustment logic 145 receives a current lead/lag detection result (UD) 130 that 130 has the first logical value (e.g., logic 0) when the feedback clock signal (clkf) 180 for a current cycle lags the second clock signal (clk2r) 120 for the current cycle, or a second logical value (e.g., logic 1) when the feedback clock signal (clkf) 180 for the current cycle leads the second clock signal (clk2r) 120 for the current cycle. Once every two clock cycles of second clock signal (clk2r) 120, the DCO speed direction adjustment logic 145 processes the comparison result (COMP), the previous lead/lag detection result (UDP) 130' and the current lead/lag detection result (UD) 130 to generate a DCO cycle time direction adjustment signal 146.

As shown in Table 2 below, the DCO cycle time direction adjustment signal 146 indicates either a command (e.g., 10) for a positive adjustment of the current DCO cycle time to increase a next DCO cycle time in comparison to the current DCO cycle time (e.g., such that the next DCO cycle time is increased in comparison to the current DCO cycle time), a command (e.g., 01) for a negative adjustment of the current DCO cycle time to decrease a next DCO cycle time in comparison to the current DCO cycle time (e.g., such that the next DCO cycle time is decreased in comparison to the current DCO cycle time), or a command (e.g., 00) for a null adjustment of the current DCO cycle time to keep a next DCO cycle time the same as the current DCO cycle time (e.g., such that the next DCO cycle time remains the same in comparison to the current DCO cycle time).

TABLE 2

| UDP | UD | COMP | Direction [1:0] | Comment |
|---|---|---|---|---|
| 0 | 0 | 0 | 01 | Decrease DCO cycle time |
| 0 | 0 | 1 | 00 | Keep DCO cycle time |
| 0 | 1 | X | 10 | Increase DCO cycle time |
| 1 | 0 | X | 01 | Decrease DCO cycle time |

TABLE 2-continued

| UDP | UD | COMP | Direction [1:0] | Comment |
|---|---|---|---|---|
| 1 | 1 | 0 | 10 | Increase DCO cycle time |
| 1 | 1 | 1 | 00 | Keep DCO cycle time |

As shown in Table 2, the DCO cycle time direction adjustment signal 146 indicates a command (e.g., 01) for the negative adjustment: (1) when the current lead/lag detection result (UD) 130 generated by lead/lag determination circuitry 125 has the first logical value (e.g., 0), the previous lead/lag detection result (UDP) 130' has the first logical value (e.g. 0) and the speed comparator 143 generates the second comparison result (e.g., 0), or (2) when the current lead/lag detection result (UD) 130 generated by lead/lag determination circuitry 125 has the first logical value (e.g., 0), the previous lead/lag detection result (UDP) 130' has the second logical value (e.g., 1) and the speed comparator 143 generates either the first comparison result or the second comparison result (e.g., 1 or 0).

The DCO cycle time direction adjustment signal 146 indicates a command (e.g., 10) for the positive adjustment: (1) when the current lead/lag detection result (UD) 130 generated by lead/lag determination circuitry 125 has the second logical value (e.g., 1), the previous lead/lag detection result (UDP) 130' has the first logical value (e.g., 0) and the speed comparator 143 generates either the first comparison result or the second comparison result (e.g., 1 or 0), or (2) when the current lead/lag detection result (UD) 130 generated by lead/lag determination circuitry 125 has the second logical value (e.g., 1), the previous lead/lag detection result (UDP) 130' has the second logical value (e.g., 1), and the speed comparator 143 generates the second comparison result (e.g., 0).

The DCO cycle time direction adjustment signal 146 indicates a command (e.g., 00) for the null adjustment: (1) when the current lead/lag detection result (UD) 130 generated by lead/lag determination circuitry 125 has the first logical value (e.g., 0), the previous lead/lag detection result (UDP) 130' has the first logical value (e.g., 0), and the speed comparator 143 generates the first comparison result (e.g., 1), or (2) when the current lead/lag detection result (UD) 130 generated by lead/lag determination circuitry 125 has the second logical value (e.g., 1), the previous lead/lag detection result (UDP) 130' has the second logical value (e.g., 1), and the speed comparator 143 generates the first comparison result (e.g., 1).

The DCO speed step adjustment logic 147 receives inputs that include the previous lead/lag detection result (UDP) 130', the current lead/lag detection result (UD) 130, the current skew value (SV) 140, the previous skew value (SVP) 140', a PLL feedback divide number (DF) 175, a unit DCO cycle time change ($T_{DU}$), a unit delay ($T_{SU}$) of a digital skew measure, and a constant value (a) between two and four that defines a skew pull-back speed. Based on the inputs, the DCO speed step adjustment logic 147 generates a step adjustment ($\Delta$VCN) 148 that is used, in some conditions, to adjust cycle time ($T_{DCO}$) of the current DCO control signal when generating the new DCO control signal (VCN) 150. As will be described below, the step adjustment ($\Delta$VCN) 148 includes a speed adjustment "term" and a skew adjustment "term" that are used to adjust the cycle time ($T_{DCO}$) and thus the cycle time of the high-frequency clock signal 160 that is generated based on the DCO control signal 150. The speed adjustment "term" of the step adjustment ($\Delta$VCN) 148 is used to adjust the speed the DCO to match with an expected speed, and the skew adjustment "term" of the step adjustment (ΔVCN) 148 is used to adjust phase of the DCO clock to match with phase of the reference clock.

How the step adjustment (ΔVCN) 148 is computed depends on whether the current lead/lag detection result (UD) 130 for the current cycle of the second clock signal (clk2r) 120 is equal to the previous lead/lag detection result (UDP) 130' for the previous cycle of the second clock signal (clk2r) 120. By contrast, when the current lead/lag detection result (UD) 130 for the current cycle of the second clock signal (clk2r) 120 is not equal to the previous lead/lag detection result (UDP) 130' for the previous cycle of the second clock signal (clk2r) 120, the step adjustment (ΔVCN) 148 can be generated by computing a value using equation (3).

When the current lead/lag detection result (UD) 130 for the current cycle of the second clock signal (clk2r) 120 is equal to the previous lead/lag detection result (UDP) 130' for the previous cycle of the second clock signal (clk2r) 120, the DCO speed step adjustment logic 147 computes the the step adjustment (ΔVCN) 148 using equation (2) as follows:

$$\text{step} = ((SV-SVP)*T_{SU})/(2*DF*T_{DU})(SV*T_{SU})/(\alpha*DF*T_{DU}) \quad \text{Equation (2),}$$

where the term $(SV-SVP)*T_{SU}/(2*DF*T_{DU})$ represents the speed adjustment of the step adjustment (ΔVCN) 148, the term $(SV*T_{SU})/(\alpha*DF*T_{DU})$ represents the skew adjustment of the step adjustment (ΔVCN) 148, SV is the current skew value (SV), SVP is the previous skew value (SVP), $T_{SU}$ is the unit delay of digital skew measure, DF is the PLL feedback divide number (DF) 175, $T_{DU}$ is the unit DCO cycle time change, and α is a constant value between 2 and 4 that determines the skew pull back speed.

By contrast, when the lead/lag detection result 130 (UD) for the current cycle of the second clock signal (clk2r) 120 is not equal to the lead/lag detection result 130 (UDP) 130' for the previous cycle of the second clock signal (clk2r) 120, the DCO speed step adjustment logic 147 computes the step adjustment (ΔVCN) 148 using equation (3) as follows:

$$\text{step} = ((SV+SVP)*T_{SU})/(2*DF*T_{DU})(SV*T_{SU})/(\alpha*DF*T_{DU}) \quad \text{Equation (3),}$$

where the term $(SV+SVP)*T_{SU}/(2*DF*T_{DU})$ represents the speed adjustment, and the term $(SV*T_{SU})/(\alpha*DF*T_{DU})$ represents the skew adjustment.

The DCO speed adjustment logic 149 receives a current DCO control signal, the DCO cycle time direction adjustment signal 146 and the step adjustment (ΔVCN) 148. The DCO speed adjustment logic 149 generates a new DCO control signal 150 by adjusting the current DCO control signal based on the DCO cycle time direction adjustment signal 146 and the step adjustment (ΔVCN) 148. Whether or not the step adjustment (ΔVCN) 148 is applied at DCO speed adjustment logic 149 to adjust the cycle time ($T_{DCO}$) of the current DCO control signal (VCN) depends on value of the DCO cycle time direction adjustment signal 146. When the DCO cycle time direction adjustment signal 146 has a first value (e.g., 01), the DCO speed adjustment logic 149 generates the new DCO control signal (VCN) 150 by decreasing the cycle time ($T_{DCO}$) of the current DCO control signal (VC) according to the step adjustment (ΔVCN) 148 supplied from DCO speed step adjustment logic 147. When the DCO cycle time direction adjustment signal 146 has a second value (e.g., 10), the DCO speed adjustment logic 149 generates the new DCO control signal (VCN) 150 by increasing the cycle time ($T_{DCO}$) of the current DCO control signal (VC) according to the step adjustment (ΔVCN) 148 supplied from DCO speed step adjustment logic 147. When the DCO cycle time direction adjustment signal 146 has a third value (e.g., 00), the DCO speed adjustment logic 149 generates the new DCO control signal (VCN) 150 by maintaining the cycle time ($T_{DCO}$) of the current DCO control signal (VC) without applying the step adjustment (ΔVCN) 148 supplied from DCO speed step adjustment logic 147.

Figure 8A:
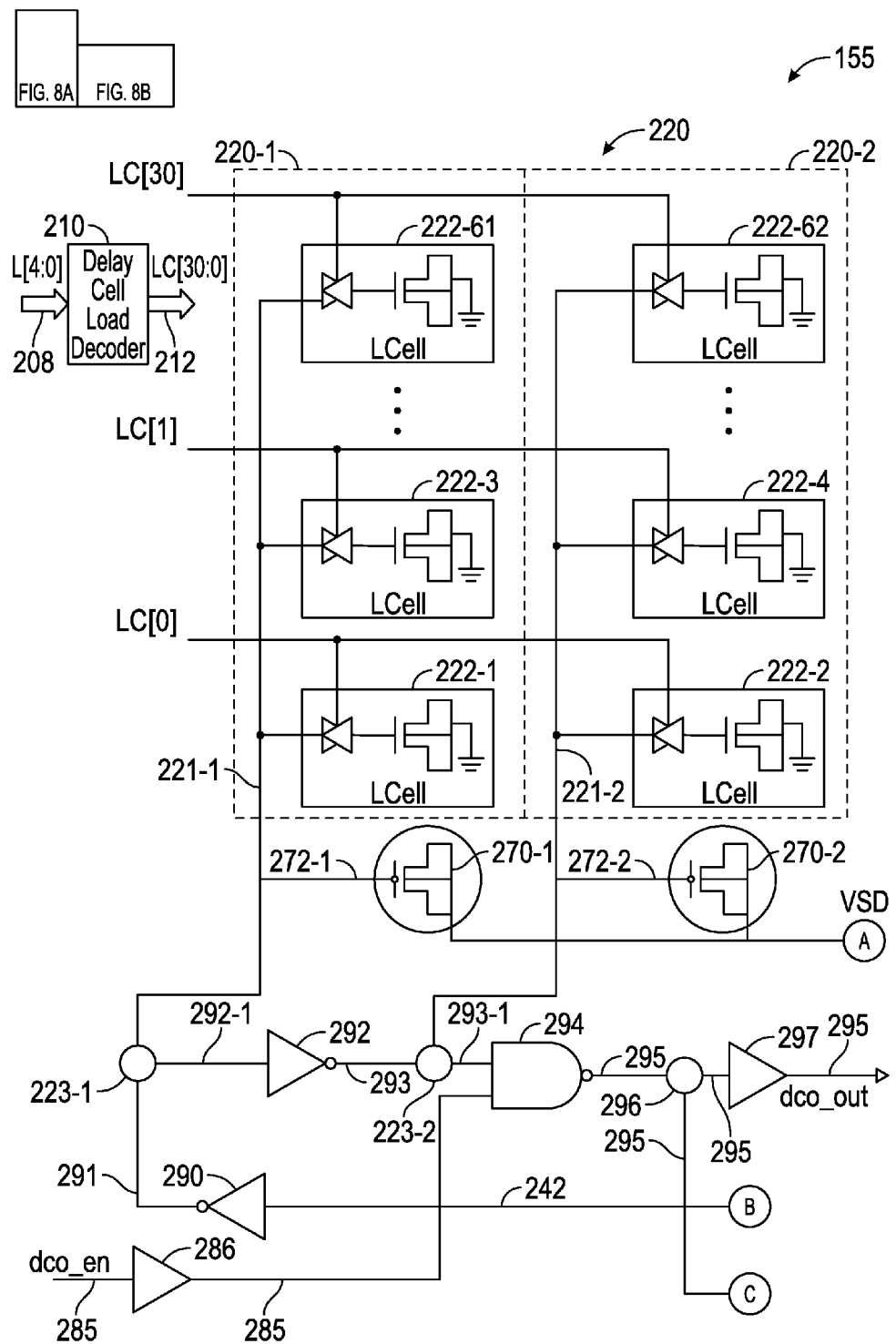
FIGS. 8A and 8B are a schematic representation of an exemplary digital controlled oscillator (DCO) in accordance with the disclosed embodiments.
Figure 8B:
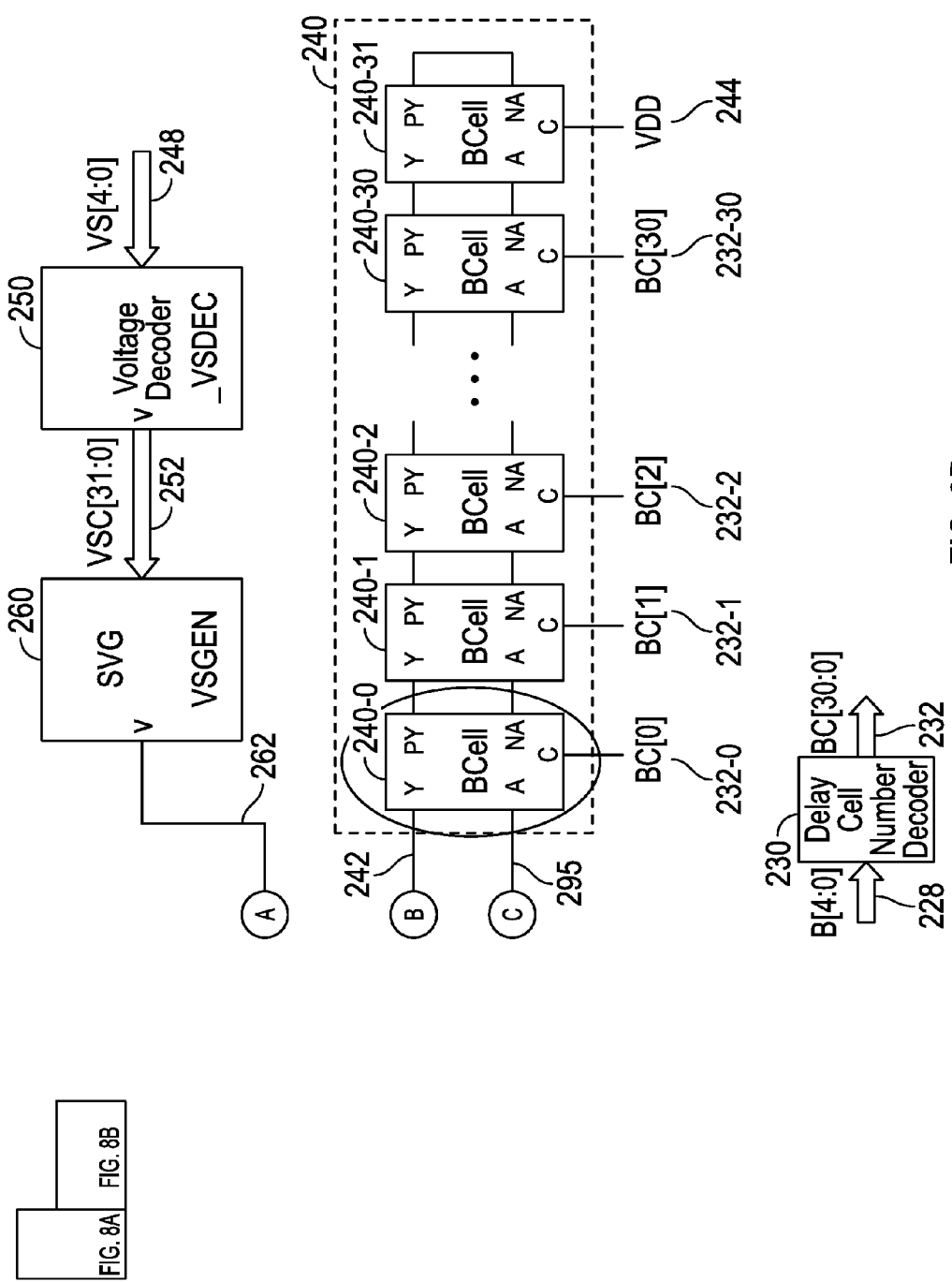

FIGS. 8A and 8B are a schematic representation of an exemplary digital controlled oscillator (DCO) 155 that can be implemented in the PLL control system 100 of FIG. 1. FIGS. 8A and 8B collectively illustrate the exemplary digital controlled oscillator (DCO) 155. The DCO 155 includes a load control decoder 210, a load control cell 220, a delay cell number decoder 230, a delay cell chain 240, a voltage decoder 250, a substrate voltage generator 260, capacitance elements 270-1, 270-2, a buffer 286 that receives an enable signal (dco_en) 285 that enables or disables the DCO 155, load adjustment delay cells 290, 292 (referred to herein as a first load adjustment delay cell 290 and a second load adjustment delay cell 292), a NAND gate 294, and a buffer 297.

The load control cell 220 includes an array of load cells 222. The array of load cells 222 includes a first set 220-1 of the load cells and a second set 220-2 of the load cells. Each of the array of load cells 222 are grouped in pairs such that one of the first set 220-1 of the load cells is paired with one of the second set 220-2 of load cells.

The first load adjustment delay cell 290 and the second load adjustment delay cell 292 are always in the delay loop of the DCO. Their load can be adjusted. For example, in one implementation, when one of the load adjustment delay cells is switched on the delay (attributable to the first load adjustment delay cell 290 and the second load adjustment delay cell 292) can change by 3 picoseconds (e.g., from 30 picoseconds to 33 picosecond).

The load control decoder 210 can generate a load control signal 212 that is applied to the load control cell 220 to control loading of the first load adjustment delay cell 290 and the second load adjustment delay cell 292. The load control signal 212 includes a set of binary values (LC [30:0]) that are applied to the first set 220-1 and the second set 220-2 of the load cells such that each particular pair of load cells 222 is configured to receive a particular binary value from the load control signal 212 (e.g., 31 values in the exemplary implementation illustrated) that are applied to an array of load cells 222 (e.g., 62 load cells). In other words, each load cell in a particular pair of load cells 222 receives the same value from the load control (LC[x]) signal 212. The odd numbered load cells 222 contribute to the voltage at node 223-1 and the even numbered load cells 222 contribute to the voltage at node 223-2.

The first set 220-1 of the load cells 222 output a first load signal 221-1 to control an amount of loading on the second load adjustment delay cell 292. The second set 220-2 of the load cells 222 output a second load signal 221-2 to control an amount of loading on the first load adjustment delay cell 290. By changing the number of load cells switched on, this configuration allows the loading of the second load adjustment delay cell 292 and the first load adjustment delay cell 290 to be changed linearly thereby allowing the DCO cycle time to be changed change linearly via the load control signal 212 depending on the number of load cells switched on at any given time.

Figure 9:
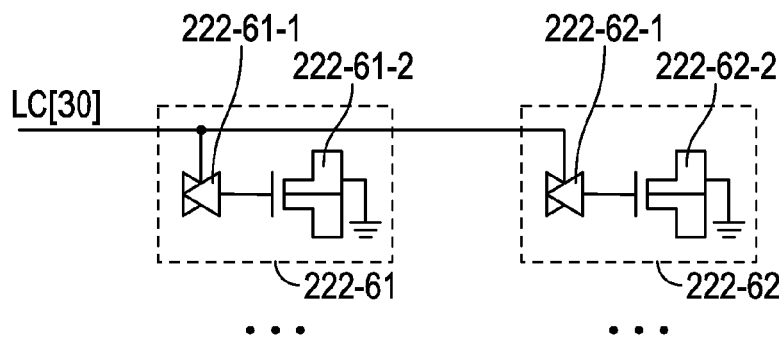
FIG. 9 is a schematic diagram that shows a pair of load cells from FIG. 8A in accordance with one exemplary implementation of the disclosed embodiments.

FIG. 9 is a schematic diagram that shows a pair of load cells 222 from FIG. 8A, specifically load cell pair 222-61 and 222-62 of FIG. 8A. Each of the load cells 222-61, 222-62 in FIG. 9 includes MOS capacitor 222-61-2, 222-62-2 that is coupled between a pass gate 222-61-1, 222-62-1 of that particular load cell and ground. In each particular pair of load cells (e.g., FIG. 9) each pass gate 222-61-1, 222-62-1 receives a binary value of the load control signal 212. The load contribution of each load cell is controllable based on the binary value of the load control signal 212 such that the MOS capacitor will not contribute to the total load on a first node 223-1 and a second node 223-2 when the binary value of the load control signal 212 has a first value and the pass gate is off, and such that the MOS capacitor will contribute to the total load on the first node 223-1 and the second node 223-2 when the binary value of the load control signal 212 has a second value and the pass gate is on. If this control signal (LC[x]) is '0', then this pass gate is off, and the MOS capacitor will not contribute to the total load of node 223-1 and 223-2 (e.g., the load contribution of this load cell includes only the capacitance of the pass gate). If this control signal (LC[x]) is '1', then this pass gate is on, and the MOS capacitor will contribute to the total load of node 223-1 and 223-2, and make a delay incremental on DCO loop delay (e.g., the total load contribution of this load cell includes both the capacitance of the pass gate and the capacitance of the MOS capacitor). As such when the control pin is switched on or off by control signal (LC[x]), there will be a fixed delta load change.

Based on a number command signal 228, the delay cell number decoder 230 can generate a delay cell number control vector 232 that includes a set of binary values BC [30:0] (e.g., 31 values in the exemplary implementation illustrated). The number command signal 228 is a 5-bit binary control signal that is processed by the delay cell number decoder 230 to generate the delay cell number control vector 232.

The delay cell chain 240 is coupled to node 296 and to an input of the first load adjustment delay cell 290. The delay cell chain 240 includes a set of selectable delay cells 240-0 . . . 240-31 (e.g., 31 load cells) that are coupled to each other in series. The delay cell number control vector 232 is applied to the delay cell chain 240. In response to the delay cell number control vector 232 and DCO output signal (dco_out) 295 from the NAND gate 294, the delay cell chain 240 generates a delay cell output signal 242. Each of the delay cells 240-0 . . . 240-31 has the same delay (e.g., approximately 60 picoseconds in one implementation), and they can be included in the delay loop or excluded from the delay loop of the delay cell chain 240. The values of the delay cell number control vector 232 are used to change the number of delay cells 240-0 . . . 240-31 that are included in the delay loop of the DCO 155. To explain further, the delay cell number control vector 232 includes a set of binary values BC [30:0] (e.g., 31 values in the exemplary implementation illustrated) that are applied to the set of selectable delay cells 240 (except for the last selectable delay cell 240-31 in the chain since a first supply voltage (VDD) 244 is applied to the last selectable delay cell 240-31 in the chain). Each of the selectable delay cells 240-0 . . . 240-30 receives a particular binary value of the delay cell number control vector 232 to the number of the selectable delay cells 240-0 . . . 240-31 that are part of the delay cell chain 240. In other words, by varying the values BC[30:0] of the delay cell number control vector 232, the number of delay cells 240 that are part of the delay cell chain 240 (and that contribute to a total loop delay of the DCO 155) can be tuned. The delay cell output signal 242 changes based on the number of the selectable delay cells 240-0 . . . 240-31 that are part of the delay cell chain 240.

Figure 10:
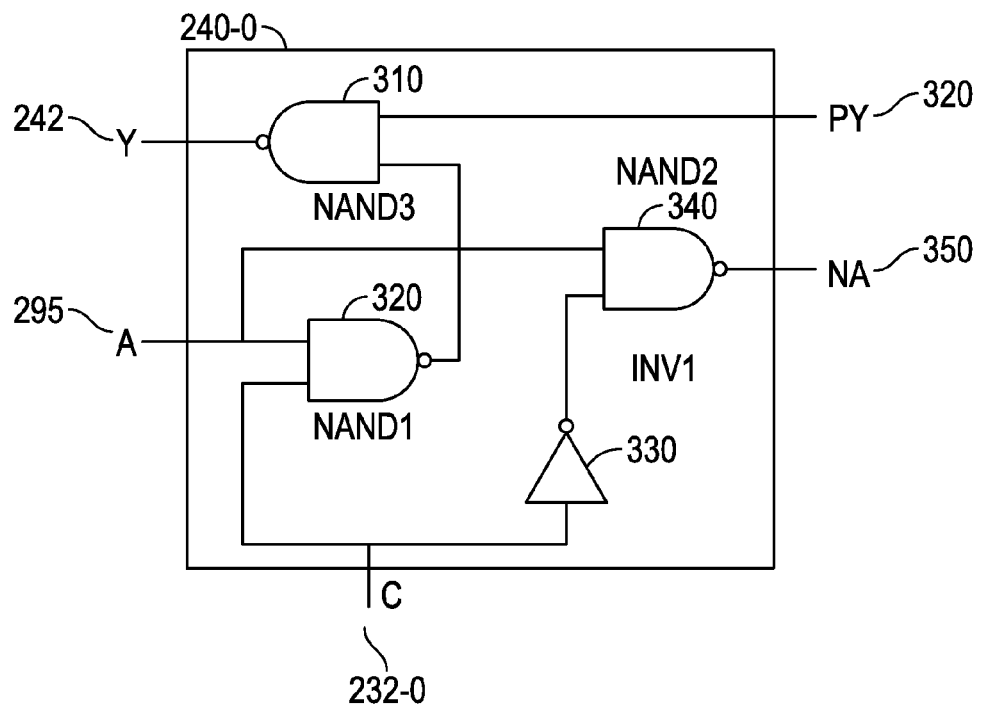
FIG. 10 is a schematic diagram that shows one delay selectable cell in accordance with one exemplary implementation of the disclosed embodiments.

To explain further, FIG. 10 shows the schematic of one selectable delay cell 240-0 that includes three NAND gates 310, 320, 240 and one inverter 330. As illustrated in FIG. 10, the selectable delay cell 240-0 receives the delay cell number control vector 232-0 BC[0] from the delay cell number decoder 230 at a first input (C). When the value of BC[0] is equal to binary 0, then delay cell 240-0 is part of the delay chain that contributes to the DCO output signal (dco_out) 295. However, when BC[0] is equal to binary 1, then selectable delay cell 240-0 is not part of the delay chain that contributes to the DCO output signal (dco_out) 295. The selectable delay cell 240-0 receives a value from the delay cell number control vector 232-0 BC[0] at a first input (C) and the DCO output signal (dco_out) 295 at a second input (A), and a 320 at another input (PY). The selectable delay cell 240-0 then outputs the delay cell output signal 242 (at Y) and a 350 (at NA). When C is '1', NAND gate 340 is blocked and NAND gate 320 is unblocked. Input PY is from next delay cell, can be configured to '1'. The delay from 'A' to 'Y' is the delay attributable to two NAND2 cells, and the delay of other delay cells (followed this delay cell) have no contribution to the total loop delay of the DCO. By contrast, when C is '0', NAND gate 320 is blocked and NAND gate 340 is unblocked, and NAND gate 310 is unblocked. As such, the delay contribution of selectable delay cell 240-0 to the total loop delay is also the delay attributable to two NAND2 cells, but the followed delay cell's delay that will also contribute to the total loop delay of the DCO.

Thus, if the values of the delay cell number control vector 232 BC[30:0] are controlled in the format of "11 . . . 1100 . . . 00" (from bit 30 to bit N are all '1', from bit N−1 to bit 0 are all '0'), then the total delay cells chain delay contribution to the loop delay of the DCO is N*BD, where BD is the cell delay of one delay cell, which is around 2 times NAND2 cell's delay.

The voltage decoder 250 generates values of a substrate voltage command signal 252 in response to a voltage command vector 248. In one non-limiting implementation, shown below in Table 3, the voltage command vector 248 (labeled VS[4:0]) can be, for example, a 5-bit binary control vector that is processed by the voltage decoder 250 to generate a substrate voltage command signal 252 that includes a plurality of binary values (VSC[0] . . . VSC[31]).

TABLE 3

| VS | VSC |
| --- | --- |
| 00000 | 0000000000 . . . 000001 |
| 00001 | 0000000000 . . . 000010 |
| 00010 | 0000000000 . . . 000100 |
| 00011 | 0000000000 . . . 001000 |
| 00100 | 0000000000 . . . 010000 |
| 00101 | 0000000000 . . . 100000 |
| . . . | |
| 11110 | 0100000000 . . . 000000 |
| 11111 | 1000000000 . . . 000000 |

Figure 11:
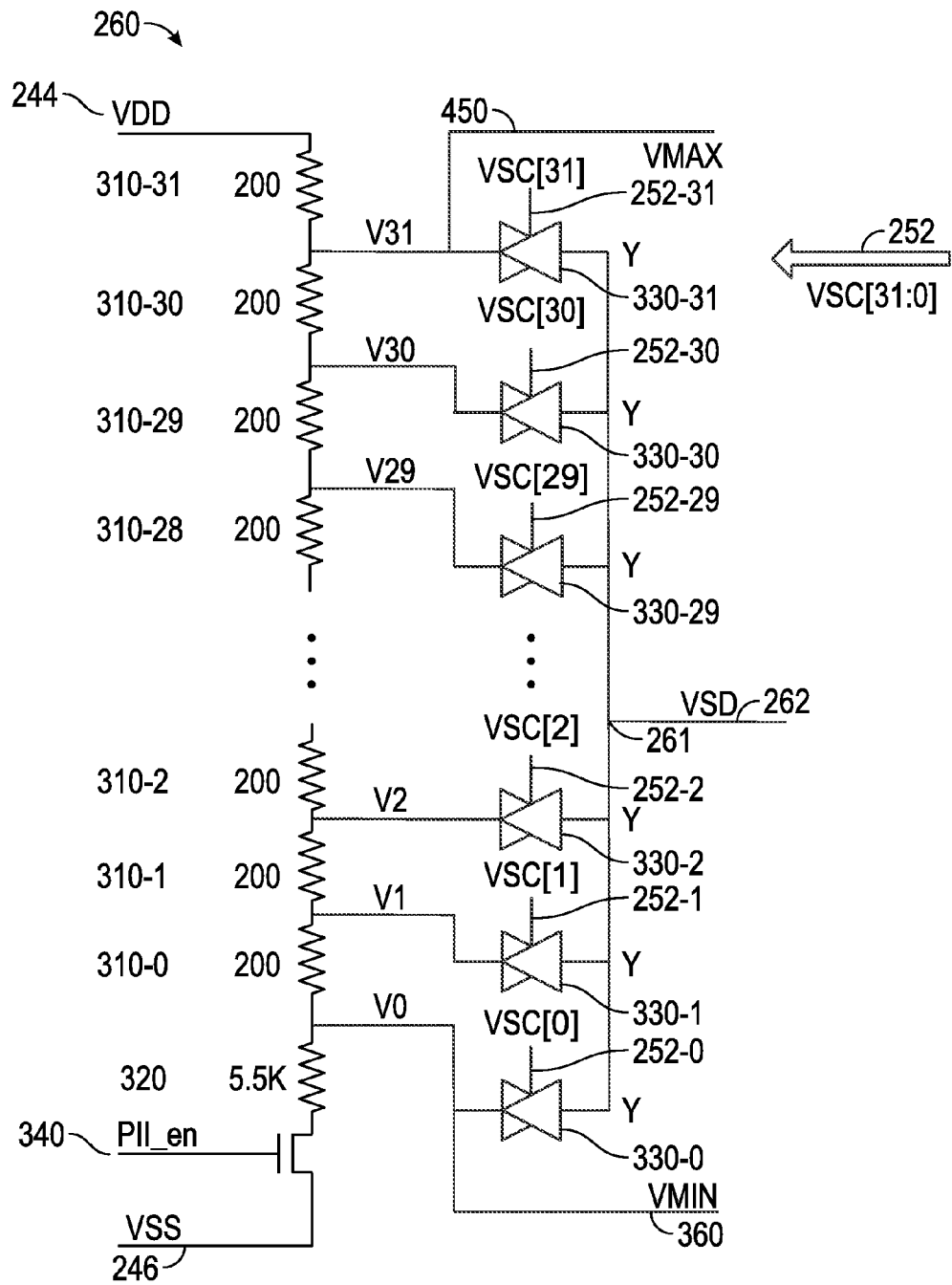
FIG. 11 is a schematic diagram that shows a substrate voltage generator in accordance with one exemplary implementation of the disclosed embodiments.

In this implementation, the substrate voltage command signal 252 includes 32 binary values VSC[0] . . . VSC[31] that are supplied as inputs 252 to the substrate voltage generator 260. FIG. 11 is a schematic diagram that shows an exemplary implementation of the substrate voltage generator 260.

In response to the substrate voltage command signal 252, the substrate voltage generator 260 generates a control signal (VSD) 262. As shown in FIG. 11, in one implementation, the substrate voltage generator 260 includes a voltage ladder (e.g., a set of first resistors 310 and a second resistor 320), a plurality of transfer gates 330 (e.g., thirty two transfer gates 330), as well as inputs including: a first supply voltage (VDD) 244, a second supply voltage (VSS) 246, an enable input (PLL_en) 440 that is coupled to and that controls a switch (not labeled), a maximum voltage (VMAX) 450, a minimum voltage (VMIN) 460, and an output for the control signal (VSD) 262.

The voltage ladder includes a set of first resistors 310 and a second resistor 320 that are coupled in series such that a ladder node couples each resistor to another resistor. Each ladder node that couples two resistors generates a voltage (V31 ... V0). Each transfer gate 330 is coupled to one of the ladder nodes. Each transfer gate receives one of the binary values from the substrate voltage command signal 252 that controls whether the voltage at that particular ladder node is output and contributes to the control signal (VSD) 262. In other words, the transfer gates 330 are used to control whether an input voltage (V31 ... V0) is allowed to pass to the output and contribute to the control signal (VSD) 262. The output voltages of the transfer gates 330 are combined at output node 261 to generate the control signal (VSD) 262.

For example, each binary value VSC can have either a logical one value or a logical zero value. The binary value VSC is applied to the transfer gate to control whether it is open or closed. When the binary value VSC is a logical zero, the transfer gate remains off and does not generate an output voltage that contributes to the control signal (VSD) 262, and when VSC has a logical one value, the transfer gate will turn on and open such that the transfer gate generates an output voltage that contributes to the control signal (VSD) 262. For instance, when VSC[31] has a logical zero value, the transfer gate 330-31 will remain off and does not generate an output voltage that contributes to the control signal (VSD) 262. By contrast, when VSC[31] has a logical one value, the transfer gate 330-31 will remain on (i.e., will open) such that the transfer gates 330-31 generates an output voltage that contributes to the control signal (VSD) 262.

The first and second capacitance elements 270-1, 270-2 are coupled to the substrate voltage generator 260. The first and second capacitance elements 270-1, 270-2 each have a substrate voltage that is adjustable in response to the control signal (VSD) 262. The control signal (VSD) 262 adjusts substrate voltages of the first and second capacitance elements 270-1, 270-2 to control a first output voltage 272-1 of the first capacitance element 270-1 and a second output voltage 272-2 of the second capacitance element 270-2 to adjust loading in the DCO 155. In one implementation, the first and second capacitance elements 270-1, 270-2 can be implemented using transistors 270 configured to function as capacitors 270. In that implementation, the control signal (VSD) 262 can be applied at source and drain regions of the transistors 270-1, 270-2 to control a substrate voltage that is applied at the source and drain regions of the transistors 270-1, 270-2 such that a load on the DCO is adjustable. In one implementation, the transistors 270-1, 270-2 can be p-type metal oxide semiconductor (PMOS) field-effect transistors (FETS) 270 that are configured to function as PMOS capacitors 270. In one exemplary implementation, the transistors 270-1, 270-2 can be low-voltage threshold (LVT) PMOSFETs having a capacitance that changes almost linearly when the control signal (VSD) 262 varies within a range from 0.5 volts to 1.2 volts to change the substrate voltage. By controlling the substrate voltages of the PMOS capacitors 270-1, 270-2, the average capacitance of the PMOS capacitors 270-1, 270-2 can be changed which, in turn, allows the load on the entire DCO to be adjusted. By utilizing a pair of PMOS capacitances (and a first set 220-1 and second set 220-2 of the load cells), the rising edge and falling edge of the DCO output signal (dco_out) 295 can be balanced.

The second load adjustment delay cell 292 is coupled between a first node 223-1 and a second node 223-2. The first load signal 221-1 is applied at the first node 223-1 and the second load signal 221-2 is applied at the second node 223-2.

The first load adjustment delay cell 290 receives the delay cell output signal 242 from the delay cell chain 240, and inverts the delay cell output signal 242 to generate an inverted delay cell output signal 291 that is provided to the first node 223-1 along with the first load signal 221-1 from the first set 220-1 of the load cells and a first output voltage 272-1 from the first capacitance element 270-1 to generate a first combined signal 292-1.

The second load adjustment delay cell 292 inverts the first combined signal 292-1 to generate a first inverted output signal 293. The second node 223-2 outputs a second combined signal 293-1 based on the second load signal 221-2 from the second set 220-2 of the load cells, a second output voltage 272-2 from the second capacitance element 270-2, and the first inverted output signal 293.

The NAND gate 294 is coupled between node 223-2 and node 296. The NAND gate 294 includes a first input that receives the second combined signal 293-1, and a second input that receives the enable signal (dco_en) 285 from buffer 286. The NAND gate 294 performs a logical NAND operation on the enable signal (dco_en) 288 and the second combined signal 293-1 to generate the DCO output signal (dco_out) 295 that is sent (through node 296) to the buffer 297. The buffer 297 outputs the DCO output signal (dco_out) 295.

CONCLUSION

A PLL control system 100 that implements the phase tracer module 142 in accordance with the disclosed embodiments can accurately adjust the half cycle time (i.e., $DF*T_{DCO}$) of the feedback clock signal (clkf) 180 based on (1) whether the feedback clock signal (clkf) 180 leads or lags the second clock signal (clk2r) 120, (2) how much skew there is between the second clock signal (clk2r) 120 and the feedback clock signal (clkf) 180, (3) whether the actual frequency of the DCO 155 is higher or lower than expected, and (4) how much speed gap there is between the actual speed of the DCO 155 and the expected speed of the DCO 155. In contrast to conventional digital PLL, a PLL control system 100 that implements the phase tracer module 142 of the disclosed embodiments can significantly reduce output clock jitter and PLL lock time.

The PLL control system 100 of the disclosed embodiments also implements an improved DCO 155 that employs three different delay methodologies. By adjusting the substrate voltage the system can achieve a small (e.g., sub-picosecond) tuning resolution and good delay linearity. Moreover, the DCO has an expanded DCO frequency range in contrast to conventional DCOs. Additionally, the PLL control system 100 consumes less silicon die area and exhibits reduced power consumption.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method, comprising:
dividing a frequency of a reference clock signal to generate a second clock signal;
generating a feedback clock signal based on a high-frequency clock signal from a digitally controlled oscillator (DCO) and a phase locked loop (PLL) feedback divide number;
generating, based on the second clock signal and the feedback clock signal, a lead/lag detection result that indicates whether the feedback clock signal leads or lags the second clock signal;
digitizing a skew between a falling edge of the second clock signal and a rising edge of the feedback clock signal to generate a skew signal that indicates the skew between the falling edge of the second clock signal and the rising edge of the feedback clock signal; and
processing, during each cycle of the second clock signal, the lead/lag detection result and the skew signal to generate a digital control signal that controls cycle time of the DCO to change frequency of the high-frequency clock signal.

2. A method as recited in claim 1, wherein processing comprises:
dynamically adjusting the digital control signal based on the lead/lag detection result and the skew signal such that frequency and phase of the high-frequency clock signal substantially match frequency and phase of the reference clock signal.

3. A method as recited in claim 1, wherein processing comprises;
generating a comparison result that indicates if a current skew value is smaller than a previous skew value; and
processing, once every two clock cycles of the second clock signal, the comparison result, a previous lead/lag detection result and a current lead/lag detection result to generate a DCO cycle time direction adjustment signal that indicates a command for either: a positive adjustment of a current DCO cycle time to increase a next DCO cycle time in comparison to the current DCO cycle time; a negative adjustment of the current DCO cycle time to decrease the next DCO cycle time in comparison to the current DCO cycle time; or a null adjustment of the current DCO cycle time to keep the next DCO cycle time the same as the current DCO cycle time.

4. A method as recited in claim 3, wherein processing further comprises:
generating a step adjustment that is used to adjust cycle time of a current DCO control signal when generating a new DCO control signal, wherein the step adjustment includes a speed adjustment and a skew adjustment that adjust the cycle time of the high-frequency clock signal, wherein the step adjustment is either: a first step adjustment that adjusts cycle time of the current DCO control signal when the current lead/lag detection result for the current cycle of the second clock signal is equal to the previous lead/lag detection result for the previous cycle of the second clock signal; or a second step adjustment that adjusts cycle time of the current DCO control signal when the current lead/lag detection result for the current cycle of the second clock signal is not equal to the previous lead/lag detection result for the previous cycle of the second clock signal;
adjusting the current DCO control signal based on the DCO cycle time direction adjustment signal and the step adjustment to generate the new DCO control signal, wherein adjusting comprises decreasing the cycle time of the current DCO control signal according to the step adjustment when the DCO cycle time direction adjustment signal has a first value; and increasing the cycle time of the current DCO control signal according to the step adjustment when the DCO cycle time direction adjustment signal has a second value; and
maintaining the cycle time of the current DCO control signal when the DCO cycle time direction adjustment signal has a third value.

5. A method as recited in claim 3, wherein generating a comparison result that indicates if a current skew value is smaller than a previous skew value, comprises:
storing the previous skew value between a falling edge of the second clock signal and a rising edge feedback clock signal in a previous cycle of the second clock signal;
determining the current skew value between the falling edge of the second clock signal and the rising edge feedback clock signal in a current cycle of the second clock signal; and
generating a first comparison result when the current skew value is less than the previous skew value; and
generating a second comparison result when the current skew value is greater than or equal to the previous skew value.

6. A method as recited in claim 4, wherein the previous lead/lag detection result has a first logical value when the feedback clock signal for a previous cycle of the second clock signal lags the second clock signal for the previous cycle of the second clock signal, and has a second logical value when the feedback clock signal for the previous cycle of the second clock signal leads the second clock signal for the previous cycle of the second clock signal, and wherein the current lead/lag detection result has the first logical value when the feedback clock signal for a current cycle lags the second clock signal for the current cycle, and has the second logical value when the feedback clock signal for the current cycle leads the second clock signal for the current cycle.

7. A method as recited in claim 6, wherein the DCO cycle time direction adjustment signal indicates a command for:
the negative adjustment such that the next DCO cycle time is decreased in comparison to the current DCO cycle time:
(1) when the current lead/lag detection result generated by the lead/lag determination circuitry has the first logical value, the previous lead/lag detection result has the first logical value and the speed comparator generates the second comparison result, or
(2) when the current lead/lag detection result generated by the lead/lag determination circuitry has the first logical value, the previous lead/lag detection result has the second logical value and the speed comparator generates either the first comparison result or the second comparison result;
the positive adjustment such that the next DCO cycle time is increased in comparison to the current DCO cycle time:

(1) when the current lead/lag detection result generated by the lead/lag determination circuitry has the second logical value, the previous lead/lag detection result has the first logical value and the speed comparator generates either the first comparison result or the second comparison result, or (2) when the current lead/lag detection result generated by the lead/lag determination circuitry has the second logical value, the previous lead/lag detection result has the second logical value, and the speed comparator generates the second comparison result; and the null adjustment such that the next DCO cycle time remains the same in comparison to the current DCO cycle time:

(1) when the current lead/lag detection result generated by the lead/lag determination circuitry has the first logical value, the previous lead/lag detection result has the first logical value, and the speed comparator generates the first comparison result, or (2) when the current lead/lag detection result generated by the lead/lag determination circuitry has the second logical value, the previous lead/lag detection result has the second logical value, and the speed comparator generates the first comparison result.

8. A phase locked loop (PLL) control system, comprising:
a clock signal generator that is configured to divide a frequency of a reference clock signal to generate a second clock signal;
a digitally controlled oscillator (DCO) that is configured to generate a high frequency clock signal;
a synchronous high-speed counter that is configured to generate a feedback clock signal based on the high-frequency clock signal and a PLL feedback divide number;
lead/lag determination circuitry that is configured to generate a lead/lag detection result that indicates whether the feedback clock signal leads or lags the second clock signal;
a skew digitizer that is configured to digitize a skew between a falling edge of the second clock signal and a rising edge of the feedback clock signal to generate askew signal that indicates the skew between the falling edge of the second clock signal and the rising edge of the feedback clock signal; and
a phase tracer module that is configured to process, during each cycle of the second clock signal, the lead/lag detection result and the skew signal to generate a digital control signal that controls cycle time of the DCO to change frequency of the high-frequency clock signal.

9. A phase locked loop control system as recited in claim 8, wherein the phase tracer module dynamically adjusts the digital control signal based on the lead/lag detection result and the skew signal such that frequency and phase of the high-frequency clock signal substantially match frequency and phase of the reference clock signal.

10. A phase locked loop control system as recited in claim 8, wherein the phase tracer module comprises:
a speed comparator configured to: generate a comparison result by determining if a current skew value is smaller than a previous skew value;
DCO speed direction adjustment logic configured to: process, once every two clock cycles of the second clock signal, the comparison result, a previous lead/lag detection result and a current lead/lag detection result to generate a DCO cycle time direction adjustment signal that indicates a command for either: a positive adjustment of a current DCO cycle time to increase a next DCO cycle time in comparison to the current DCO cycle time; a negative adjustment of the current DCO cycle time to decrease the next DCO cycle time in comparison to the current DCO cycle time; or a null adjustment of the current DCO cycle time to keep the next DCO cycle time the same as the current DCO cycle time;
DCO speed step adjustment logic configured to: generate, based on inputs, a step adjustment; and
DCO speed adjustment logic configured to: generate a new DCO control signal by adjusting a current DCO control signal based on the DCO cycle time direction adjustment signal and the step adjustment.

11. A phase locked loop control system as recited in claim 10, wherein the speed comparator is further configured to:
store the previous skew value between a falling edge of the second clock signal and a rising edge feedback clock signal in a previous cycle of the second clock signal; and
receive the skew signal and determine the current skew value between the falling edge of the second clock signal and the rising edge feedback clock signal in a current cycle of the second clock signal,
wherein the comparison result comprises a first comparison result or a second comparison result.

12. A phase locked loop control system as recited in claim 11, wherein the speed comparator configured to:
generate the first comparison result when the speed comparator determines that the current skew value is less than the previous skew value; and
generate the second comparison result when the speed comparator determines that the current skew value is greater than or equal to the previous skew value.

13. A phase locked loop control system as recited in claim 10, wherein the DCO speed direction adjustment logic is further configured to:
store the previous lead/lag detection result, wherein the previous lead/lag detection result has a first logical value when the feedback clock signal for a previous cycle of the second clock signal lags the second clock signal for the previous cycle of the second clock signal, and has a second logical value when the feedback clock signal for the previous cycle of the second clock signal leads the second clock signal for the previous cycle of the second clock signal;
receive the current lead/lag detection result, wherein the current lead/lag detection result has the first logical value when the feedback clock signal for a current cycle lags the second clock signal for the current cycle, and has the second logical value when the feedback clock signal for the current cycle leads the second clock signal for the current cycle.

14. A phase locked loop control system as recited in claim 13, wherein the DCO cycle time direction adjustment signal indicates a command for:
the negative adjustment such that the next DCO cycle time is decreased in comparison to the current DCO cycle time:
(1) when the current lead/lag detection result generated by the lead/lag determination circuitry has the first logical value, the previous lead/lag detection result has the first logical value and the speed comparator generates the second comparison result, or
(2) when the current lead/lag detection result generated by the lead/lag determination circuitry has the first logical value, the previous lead/lag detection result has the second logical value and the speed comparator generates either the first comparison result or the second comparison result;

the positive adjustment such that the next DCO cycle time is increased in comparison to the current DCO cycle time:
(1) when the current lead/lag detection result generated by the lead/lag determination circuitry has the second logical value, the previous lead/lag detection result has the first logical value and the speed comparator generates either the first comparison result or the second comparison result, or
(2) when the current lead/lag detection result generated by the lead/lag determination circuitry has the second logical value, the previous lead/lag detection result has the second logical value, and the speed comparator generates the second comparison result; and the null adjustment such that the next DCO cycle time remains the same in comparison to the current DCO cycle time:
(1) when the current lead/lag detection result generated by the lead/lag determination circuitry has the first logical value, the previous lead/lag detection result has the first logical value, and the speed comparator generates the first comparison result, or
(2) when the current lead/lag detection result generated by the lead/lag determination circuitry has the second logical value, the previous lead/lag detection result has the second logical value, and the speed comparator generates the first comparison result.

15. A phase locked loop control system as recited in claim 10, wherein the inputs received by the DCO speed step adjustment logic comprise: the previous lead/lag detection result, the current lead/lag detection result, the current skew value, the previous skew value, a PLL feedback divide number, a unit DCO cycle time change ($T_{DU}$), a unit delay ($T_{SU}$) of a digital skew measure, and a constant value between two and four that defines a skew pull-back speed, and
wherein the DCO speed adjustment logic is configured to: receive the current DCO control signal, the DCO cycle time direction adjustment signal and the step adjustment.

16. A phase locked loop control system as recited in claim 15, wherein the DCO speed step adjustment logic is configured to:
generate a step adjustment that is used to adjust cycle time of the current DCO control signal when generating the new DCO control signal,
wherein the step adjustment is either:
a first step adjustment that adjusts cycle time of the current DCO control signal when the current lead/lag detection result for the current cycle of the second clock signal is equal to the previous lead/lag detection result for the previous cycle of the second clock signal; or
a second step adjustment that adjusts cycle time of the current DCO control signal when the current lead/lag detection result for the current cycle of the second clock signal is not equal to the previous lead/lag detection result for the previous cycle of the second clock signal.

17. A phase locked loop control system as recited in claim 16, wherein the step adjustment comprises:
a speed adjustment to adjust the cycle time of the high-frequency clock signal, wherein the speed adjustment is generated based on the current skew value, the previous skew value, the unit delay ($T_{SU}$) of digital skew measure, the PLL feedback divide number, and the unit DCO cycle time change ($T_{DU}$); and
a skew adjustment to adjust the cycle time of the high-frequency clock signal, wherein the skew adjustment is generated based on the current skew value, the unit delay ($T_{SU}$) of digital skew measure, the PLL feedback divide number, the unit DCO cycle time change ($T_{DU}$) and the constant value between two and four that defines a skew pull-back speed.

18. A phase locked loop control system as recited in claim 16, wherein the DCO speed adjustment logic is configured to generate the new DCO control signal by:
decreasing the cycle time of the current DCO control signal according to the step adjustment when the DCO cycle time direction adjustment signal has a first value;
increasing the cycle time of the current DCO control signal according to the step adjustment when the DCO cycle time direction adjustment signal has a second value; and
maintaining the cycle time of the current DCO control signal when the DCO cycle time direction adjustment signal has a third value.

19. A phase locked loop control system as recited in claim 15, wherein the lead/lag determination circuitry comprises:
an inverter configured to: receive and invert the second clock signal to generate an inverted version of the second clock signal; and
a D flip-flop configured to:
receive the feedback clock signal and the inverted version of the second clock signal and a reset signal; and
generate, based on the inverted version of the second clock signal and the feedback clock signal, the lead/lag detection result; and
wherein the skew digitizer comprises:
a flip-flop chain comprising a plurality of D flip-flops;
a buffer chain comprising: a plurality of buffers, wherein at each falling edge of the second clock signal, each buffer generates an output value that is provided to one of the D flip-flops, and wherein at the rising edge of the feedback clock signal, each of the output values from the buffer chain are registered at a corresponding one of the D flip-flops such that each of the D flip-flops samples the state of the corresponding buffer on the rising edge of the feedback clock signal and generates an output, wherein the outputs from each of the D flip-flops are combined to generate a signal vector; and
a decoder configured to decode the signal vector to generate the skew signal.

20. A phase locked loop control system, comprising:
means for dividing a frequency of a reference clock signal to generate a second clock signal;
means for generating a feedback clock signal based on a high-frequency clock signal from a digitally controlled oscillator (DCO) and a phase locked loop (PLL) feedback divide number;
means for generating, based on the second clock signal and the feedback clock signal, a lead/lag detection result that indicates whether the feedback clock signal leads or lags the second clock signal;
means for digitizing a skew between a falling edge of the second clock signal and a rising edge of the feedback clock signal to generate askew signal that indicates the skew between the falling edge of the second clock signal and the rising edge of the feedback clock signal; and means for processing, during each cycle of the second clock signal, the lead/lag detection result and the skew signal to generate a digital control signal that controls cycle time of the DCO to change frequency of the high-frequency clock signal.

\* \* \* \* \*